US008097399B2

(12) United States Patent
Patel et al.

(10) Patent No.: US 8,097,399 B2
(45) Date of Patent: Jan. 17, 2012

(54) PHOTOCURABLE COMPOSITIONS

(75) Inventors: Ranjana Patel, Little Hallingbury (GB); Michael Rhodes, Basel (CH); Yong Zhao, Cambridge (GB)

(73) Assignee: 3D Systems, Inc., Rock Hill, SC (US)

( * ) Notice: Subject to any disclaimer, the term of this patent is extended or adjusted under 35 U.S.C. 154(b) by 968 days.

(21) Appl. No.: 10/593,746

(22) PCT Filed: Mar. 21, 2005

(86) PCT No.: PCT/EP2005/051287

§ 371 (c)(1), (2), (4) Date: Sep. 22, 2006

(87) PCT Pub. No.: WO2005/092598

PCT Pub. Date: Oct. 6, 2005

(65) Prior Publication Data

US 2007/0205528 A1 Sep. 6, 2007

(30) Foreign Application Priority Data

Mar. 22, 2004 (EP) .................................... 04251653

(51) Int. Cl.
*G03F 7/027* (2006.01)
*B29C 67/00* (2006.01)

(52) U.S. Cl. .................. 430/281.1; 430/280.1; 430/269; 430/285.1; 430/286.1; 430/287.1; 430/284.1; 430/138; 264/401; 522/168; 522/170; 522/180

(58) Field of Classification Search ........................ None
See application file for complete search history.

(56) References Cited

U.S. PATENT DOCUMENTS 3,117,099 A 1/1964 Proops et al.
3,445,419 A 5/1969 Vanderlinde
3,661,744 A 5/1972 Kehr et al.
3,708,296 A 1/1973 Schlesinger
4,119,617 A 10/1978 Hanyuda et al.
4,230,740 A 10/1980 Moyer
4,248,960 A * 2/1981 Hein et al. .................... 430/306
4,283,480 A * 8/1981 Davies et al. .............. 430/270.1
4,289,867 A 9/1981 Martin
4,575,330 A 3/1986 Hull
4,849,320 A * 7/1989 Irving et al. ............... 430/280.1
5,167,882 A 12/1992 Jacobine et al.
5,236,967 A * 8/1993 Ohkawa et al. ................. 522/32
5,250,391 A 10/1993 Miller
5,397,662 A 3/1995 Miller
5,437,964 A 8/1995 Lapin et al.
5,476,748 A 12/1995 Steinmann et al.
5,494,618 A 2/1996 Sitzmann et al.
5,510,226 A 4/1996 Lapin et al.
5,605,941 A 2/1997 Steinmann et al.
5,639,413 A 6/1997 Crivello
5,705,116 A 1/1998 Sitzmann et al.
6,043,323 A 3/2000 Steinmann et al.
6,099,787 A 8/2000 Melisaris et al.
6,100,007 A 8/2000 Pang et al.
6,130,025 A * 10/2000 Chikaoka et al. .......... 430/280.1
6,136,497 A 10/2000 Melisaris et al.
6,259,962 B1 7/2001 Gothait
6,350,403 B1 2/2002 Melisaris et al.
6,413,496 B1 7/2002 Goodman et al.
6,413,697 B1 7/2002 Melisaris et al.
6,500,375 B1 12/2002 Aulick et al.
7,052,263 B2 5/2006 John
2001/0046642 A1 11/2001 Johnson et al.
2002/0153640 A1 10/2002 John
2002/0160309 A1 10/2002 Pang et al.
2002/0167100 A1 11/2002 Moszner et al.

(Continued)

FOREIGN PATENT DOCUMENTS

DE 4440819 A 5/1995

(Continued)

OTHER PUBLICATIONS

AN 1995:896120 from CAPLUS file of ACS on STN database Entered in STN Nov. 4, 1995, English Abstract of DE 4440819 A1, first Inventor Steinmann, 2 pages.*
English Translation of DE 4440819 generated by machine at http://epo.worldlingo.com. on Oct. 13, 2009 , 7 pages total.*
Kaufman et al (eds), Introduction to Polymer Science and Technology: An SPE Textbook, (SPE monographs: No. 2) John Wiley & Sons, New York, NY, 1977, pp. 25-26, 56-60.*
Derwent-ACC-No. 1988-123706, English abstract of JP 63068627 a, year published 1988, Derwnt Information, LTD, 3 pages printed out on Mar. 2, 2011.*

(Continued)

*Primary Examiner* — Cynthia Hamilton

(57) ABSTRACT

An optical moulding process is disclosed comprising the sequential steps of: (a)(y) forming a layer of a photocurable composition; and (bXz) irradiating selected areas of the composition in the layer with radiation from a radiation source, thereby curing the composition in said selected areas and repeating the steps a) and b) on top of an earlier cured layer to form a three dimensional structure, wherein the radiation source used in step b) is a non-coherent source of radiation and wherein the photocurable composition comprises at least two curable components: (i) 45%-95% (and preferably at least 50%, more preferably at least 60%, e.g. at least 70%) by weight of the total curable components in the composition is a first component that is photocurable and that is such that, when cured in the presence of a photocuring initiator by exposure to UV radiation having an energy of 30 mJ/cm$^2$, at least 90% of the component is cured within 50 milliseconds; and (ii) 5% to 55% (and preferably 10-40%, more preferably 15 to 30%, e.g. about 20%) by weight of the total curable components in the composition is a second component that results in the composition, on curing, shrinking, in a linear direction, by less than 3% and preferably that results in the composition having, after cure, a $T_g$ of greater than 50° C., preferably at least 100° C. and more preferably at least 120° C.

4 Claims, No Drawings

U.S. PATENT DOCUMENTS

| | | | |
|---|---|---|---|
| 2003/0118941 | A1 | 6/2003 | Hayakawa et al. |
| 2003/0198824 | A1 | 10/2003 | Fong et al. |
| 2004/0036200 | A1 | 2/2004 | Patel et al. |
| 2004/0181007 | A1 | 9/2004 | Acevedo et al. |
| 2004/0207123 | A1 | 10/2004 | Patel et al. |
| 2005/0171237 | A1 | 8/2005 | Patel et al. |
| 2006/0035034 | A1 | 2/2006 | Matsumoto et al. |

FOREIGN PATENT DOCUMENTS

| | | | | |
|---|---|---|---|---|
| EP | 1477511 | A | | 11/2004 |
| JP | 63-068627 | A | * | 3/1988 |
| WO | WO 00/21735 | A | | 4/2000 |
| WO | WO 00/55272 | A | | 9/2000 |

OTHER PUBLICATIONS

AN 1988:592287, from CAPLUS files on STN database ACS on STN, English abstract of JP 63068627 a, entered STN Nov. 25, 1988, 2 pages.*

Herbert, Alan J., *Solid Object Generation*, Journal of Applied Photographic Engineering, 8 (4), Aug. 1982, p. 185-188, May 18, 1982.

Arimitsu, Koji, *Nonlinear organic reaction of 9-fluorenylmethyl carbamates as base amplifiers to proliferate aliphatic amines and their application to a novel photopolymer system*, J. Mater. Chem., 2004, 14 (3), 336-343.

Arimitsu, Koji, *Factors affecting photosensitivity enhancement of chemically amplified photoresists by an acid amplifier*, J. Mater. Chem., 2001, 11, 295-301.

UV-Curing, Science & Technology, S.P. Pappas ed., Technology Marketing Corp. vol. 1, pp. 22-23, 27-77, vol. 2, pp. 13-17, stamp dated Aug. 1985.

Dietliker, K. K., Chemistry & Technology of UV & EB Formulations for Coatings, Inks & Paints, vol. 3., P. K. Oldring (1991), Continuation of citation 6 above pp. 327, 329, 332-359, 372-391, 394-397, 408-423.

http://torayfinechemicals.com/english/pori.html, printed Sep. 15, 2006 with a 2003.

Jacobs, Paul F, Rapid Prototyping & Manufacturing, 1992 pp. 69-83, 105-119.

* cited by examiner

PHOTOCURABLE COMPOSITIONS

CROSS REFERENCE TO RELATED APPLICATIONS

This application is the National Phase of International Application PCT/EP2005/051287 filed Mar. 21, 2005 which designated the U.S. and which claims priority to European (EP) Pat. App. No. 04251653.4 filed Mar. 22, 2004. The noted applications are incorporated herein by reference.

FIELD OF THE INVENTION

The present invention relates to photocurable compositions and processes for producing three-dimensional articles using rapid prototyping techniques. Three-dimensional articles produced from the photocurable compositions of the present invention exhibit overall high performance properties.

BACKGROUND OF THE INVENTION

Three-dimensional articles produced from CAD using layerwise rapid prototyping techniques (e.g. stereolithography) have been available for a number of years. The ultimate mechanical and other [e.g. surface finish etc] properties of such articles are derived from the materials and the CAD layering system being used.

For example, stereolithography systems, e.g. as described in U.S. Pat. No. 4,575,330, utilize complex photopolymer mixtures addressed by UV lasers to produce the 3 D articles. The polymer mixtures used in such machines have progressed from initial acrylic systems [e.g. U.S. Pat. No. 6,043,323], suitable for concept modeling, to epoxy-acrylic hybrids [e.g. U.S. Pat. Nos. 5,476,748, 6,136,497, 6,136,497, 6,100,007, 6,413,496, 6,099,787, 6,350,403, 5,437,964, 5,510,226, 5,494,618, 5,705,116] which have resulted in better properties [e.g. lower shrinkage, higher flexural modulus, better elongation at break, higher tensile properties, and higher impact resistance properties], usually however requiring compromises in one property or another. The improved performance from the epoxy-acrylic hybrids nevertheless has been useful for modeling certain technical properties.

There are alternative systems which yield layered three dimensional systems: Laser Sintering using thermoplastic powders, Extrusion Systems using extrudeable pastes, Jet Printing directly or onto Powders using fluids etc. All these material-machine systems have limitations in one area or another, which limit direct usefulness of the finally formed three-dimensional article. All of these systems also have limitations for speed of access to the formed three-dimensional articles: especially from those, which use laser scanning exposure processes.

There is continuing need to achieve, at higher speeds than hitherto possible, directly useful technical grade, three-dimensional articles.

Availability of such articles shows promise to open up the market, from service bureau type trade shops to 'in house' engineering design departments, and from rapid prototyping to short to medium volume rapid manufacturing.

In addition to these attributes, also highly desired are cured properties, which match or better those from thermoplastic polymers, used in conventionally produced articles [e.g. via injection moulds using polypropylene, ABS, polycarbonates, PEEK etc to name a few]

Further, there is a growing need for rapid prototyping materials and processes that produce three-dimensional articles, which are stable with time. In the past, articles produced by rapid prototyping were initially so brittle that increasing brittleness associated with aging went unnoticed. Oftentimes, the issue of brittleness was never confronted because articles were used only in short-term applications.

The present invention relates to photocurable compositions that can be used to produce three-dimensional articles, in a faster time frame and having superior and stable properties than hitherto possible.

Currently, the production of three-dimensional articles by selective irradiation of selected areas of successive layers of a photocurable composition uses a laser as the source of radiation since that provides a good speed of cure. Other radiation sources, which produce non-coherent radiation, cannot achieve the same curing speeds as laser radiation and require the use of much faster-curing compositions to provide sufficient green strength to enable the article to be self-supporting while, being built and before a final UV flood cure following removal from the bath in which it is built. However, the fast-curing polymers then to be brittle and to shrink substantially on curing, thereby degrading the accuracy of the model and causing parts of the model to curl.

Some prior art relating to thiolene type compositions are:

Example 1 of DE 4440819A1 describes a composition containing 76.1 g norbornen acrylate and 19.9 g polythiol which is cured under He/Cd lasers. The cured product has a high level of shrinkage: 14.4%. Cured products obtained from compositions containing about equivalent amounts by weight of norbornen acrylate and of polythiol have a lower shrinkage.

U.S. Pat. No. 4,230,740 describes compositions containing a polyene component and a thiol, typically together with a reactive diluent and a solvent which compositions are applied to a substrate and exposed to radiation, e.g. UV light, until crosslinking so as to provide non yellowing coatings on substrates. This is far from building 3 dimensional articles by optical moulding process.

EP0492953 A1 describes a stereolithography method for building a three-dimensional article using a curable resin formulation comprising compounds having plurality of norbornen groups, compounds comprising plurality of thiol groups and radical initiators. Typically similar ratios [e.g. 0.7:1 to 1.3:1] of the norbornyl compound and thiol compound are used. It is not suggested to produce 3D articles by non laser techniques. Norbornen compounds are smelly and their combination with smelly thiol compound is not recommended. Besides norbornen compounds have a low commercial availability.

U.S. Pat. No. 4,230,740 describes thiolene compositions containing allylcyanurate and thiol compounds, typically in similar ratios by weight. Usually heating for 15 minutes at 450 F is described to finish off the curing reaction.

Some prior art non-laser systems are:

WO 00/21735 describes a non-laser process but does not disclose that such a process should yield much improved mechanical properties from the resin.

U.S. Pat. No. 6,500,375 describes a three dimensional molding process involving spatial light modulators which regulate electro-magnetic irradiation falling on a resin. There is no mention that non-laser means of exposure can lead to improved properties.

Another possibility is that described in EP1250997A1 and EP1253002A1.

Another possibility is as described in US20040036200A1, US20040207123A1, WO 03041875, WO 03/099947 A1 and references therein which use jetting of UV curable fluids which are then cured by some non-laser irradiation.

Another possibility is use in direct printing e.g. U.S. Pat. No. 6,259,962 and related patents This range of art generally discloses the machine/equipment method, but do not refer to the effect of the system on the ultimate properties attainable from such machines.

Polymers can be broadly classified as thermoplastic: reform after heat to original state. Over and over again.

thermoset: set after heat. Only sets once. Can't reform

Thermoplastics crystalline: polymers arranged in a regular order amorphous: polymers arranges randomly like coil Thermosets low molecular weight monomers that crosslink and polymerize to for polymer network Elastomers Can be either thermoplastic or thermoset Thermoset elastomers: natural and synthetic rubbers Thermoplastic elastomers: plastics that mimic rubber (EPDK TPO, TPE)

The production of laser radiation requires costly equipment and it is desirable to find alternative ways to cure photocurable compositions. New photocurable compositions are needed for processes involving non-coherent actinic irradiation.

SUMMARY OF THE INVENTION

The present invention provides a process and photocurable compositions which together yield broad-spectrum properties in three-dimensional articles which are formed using CAD layer techniques involving non-laser irradiation. Preferably the resultant properties match those from conventional thermoplastic polymers.

According to a first aspect of the present invention, there is provided an optical moulding process comprising a radiation source which is a non-coherent source of radiation and wherein the photocurable composition comprises at least two curable components:

i) 45%-95% (and preferably at least 50%, more preferably at least 60%, e.g. at least 70%) by weight of the total curable components in the composition is a first component that is photocurable and that is such that, when cured in the presence of a photocuring initiator by exposure to UV radiation having an energy of 30 mJ/cm$^2$, at least 90% of the component is cured within 50 milliseconds; and ii) 5% to 55% (and preferably 10-40%, more preferably 15 to 30%, e.g. about 20%) by weight of the total curable components in the composition is a second component that results in the composition, on curing, shrinking, in a linear direction, by less than 3% and preferably that results in the composition having, after cure, a $T_g$ of greater than 50° C., preferably at least 100° C. and more preferably at least 120° C.

The present invention also provides a layer wise optical moulding process which uses a non-coherent source of radiation and wherein the photocurable composition comprises at least two curable components:

iii) at least 70%, preferably at least 80%, more preferably at least 85% by weight of the total curable components in the composition is a first component that is photocurable and that is such that, when cured in the presence of a photocuring initiator by exposure to $T_g$ radiation having an energy of 30 mJ/cm$^2$, at least 90% by weight of the component is cured within 50 milliseconds; and iv) at least 5%, preferably at most 30%, preferably at most 20%, preferably at most 15% by weight of the total curable components in the composition is a second component that results in the composition, on curing, shrinking, in a linear direction, by less than 3% in length and preferably that results in the composition having, after cure, a $T_g$ of greater than 50° C., preferably at least 100° C. and more preferably at least 120° C.

The composition has a high speed of cure and so can be used in connection with non-coherent radiation sources, which at the same time provides an article with good physical properties.

Preferably at least 90% of the first component is cured within 50 milliseconds, when the first component is cured in the presence of a photocuring initiator by exposure to UV radiation having energy of 20 mJ/cm$^2$ (more preferably 10 mJ/cm$^2$).

Preferably, at least 70, 71, 72, 73, 74, 75, 76, 77, 78, 79, 80, 81, 82, 83, 84, 85, 86, 87, 88 or 89% by weight of the total curable composition is formed of first component. Preferably at least 90% by weight of the total curable composition is formed of first component. More preferably at least 91, 92, 93, 94 or 95% by weight of the total curable composition is formed of first component.

Preferably at least 5, 6, 7, 8, 9 or 10% by weight of the total curable components in the composition is formed of second component. Preferably the second component is present in an amount of at most 15%, preferably comprised between 5 and 15%, by weight of the total curable composition.

The first component optionally comprises one or more materials selected from the group consisting of:

(a) an acrylate, e.g. mono, bis and higher order functionality acrylate, or a mixture thereof, the acrylate preferably comprising at least one acrylate having a functionality of 2 or more, (b) an amine base proliferation system comprising an amine photoinitiator, a base amplifier and an anionically curable material, e.g. a glycidyl epoxy or an acrylate or an anhydride having a functionality of at least 2, or (c) an acid amplified system comprising at least one cationically photocurable material, for example an epoxy (e.g. a cycloaliphatic epoxy or a glycidyl epoxy), a cationic photocuring initiator, e.g. tri-aryl sulfonium $SbF_6$ salts, and an acid amplifier, e.g. a tosylated compound and (d) a polymer chain, e.g. a polyester, polyether, polycarbonate, polybutadiene, polyurethane, polyalkane, or polysiloxane, having 2 or more functional photoinitation groups that, on exposure to radiation, can form reactive groups that react with curable components in the composition to incorporate the said polymer chain into the cured composition, the polymer chain preferably being a flexible and/or toughening chain.

Photopolymer systems relying on the photochemical liberation of a basic species are often of low photosensitivity. Base proliferation systems permit to improve the photosensitivity hence the speed of cure of photopolymer systems using base-catalysed reactions.

A base amplifier is a molecule readily decomposed by base catalysis to liberate a base, often an amine, which leads to autocatalytic decomposition. The process is called base proliferation. Acid amplified systems exist too for acid-catalysed reactions.

The second component optionally comprises one or more material selected from of the group consisting of:

(a) a methacrylate, e.g. mono, bis or higher order functionality methacrylate or a mixture thereof, and preferably comprising at least one methacrylate with a functionality of at least 2, (b) a compound having at least one terminal —SH, —NH or —OH group, e.g. an oligomeric liquid polysulphides, a mercaptan monomer, or a reactive alkane bearing at least one amine, hydroxy or thio terminal group, and (c) an isocyanate, optionally blended with a latent polyol, e.g. derived from an epoxy, or a polyamine, e.g. derived from a blocked amine, for example an aliphatic amine derived from a carbamate, or a hybrid bearing an isocyanate group and a urethane group, or (d) an epoxy, e.g. a cycloaliphatic epoxy or a glycidyl epoxy, optionally with an acid amplifier, and (e) an oxetane or a furan.

Preferably the first component (the fast-curing component) comprises one or more materials selected from the group consisting of:

(i) an acrylate, e.g. mono, bis and higher order functionality acrylate, or a mixture thereof the acrylate preferably comprising at least one acrylate having a functionality of 2 or more, or (ii) an amine base proliferation system comprising a photoamine initiator and a photo-polybase amplifier with an anionically photocurable material, e.g. an anhydride having a functionality of at least 2, or (iii) an acid amplified system comprising at least one cationically photocurable material, for example an epoxy (e.g. a cycloaliphatic epoxy), a cationic photocuring initiator, e.g. tri-aryl sulfonium $SbF_6$ salts, and an acid amplifier, e.g. a tosylated compound and (iv) a polymer chain, e.g. a polyester, polyether, polycarbonate, polybutadiene, polyurethane, polyalkane, or polysiloxane, having 2 or more functional photoinitation groups that, on exposure to radiation, can form reactive groups that react with curable components in the composition to incorporate the said polymer chain into the cured composition, the polymer chain preferably being a flexible and/or toughening chain.

Preferably the second component (slow reacting component) comprises one or more material selected from of the group consisting of:

(v) a methacrylate, e.g. mono, bis or higher order functionality methacrylate or a mixture thereon and preferably comprising at least one methacrylate with a functionality of at least 2, (vi) a compound having at least one terminal —SH, —NH or —OH group, e.g. an oligomeric liquid polysulphides, a mercaptan monomer, or a reactive alkane bearing at least one amine, hydroxy or thio terminal group, and (vii) i) an isocyanate, optionally blended with a latent polyol, e.g. derived from an epoxy, or a polyamine, e.g. derived from a blocked amine, for example an aliphatic amine derived from a carbamate, or ii) a hybrid bearing an isocyanate group and a urethane group, iii) an epoxy, e.g. a cycloaliphatic epoxy or a glycidyl epoxy, optionally with an acid amplifier, and iv) an oxetane, a furan or an ortho-spiro compound The second component may comprise a polythiol having two or more thiol groups per molecule, e.g. a polythiol obtained by esterification of a polyol with an alpha. or β-mercaptocarboxylic acid (such as thioglycolic acid, or β-mercaptopropionic acid), or pentaerythritol tetramercaptoacetate or pentaerythritol tetrakis-β-mercaptopropionate (PETMP).

Preferably, in the process according to the invention, the photocurable composition also contains one or more flexibiliser or toughener, (e.g. (i) a hydroxyl-containing compounds, (for example a polyester, polyether, polycarbonate or a polyurethane), or (ii) a thiol or amino counterpart of the hydroxyl versions), or a reactive rubber/elastomeric compound, (e.g. a polybutadiene having epoxy, acrylyl, amino, hydroxy, thiol, or amino functional groups, or a linear or cyclic polysiloxane having epoxy, acrylyl, hydroxyl, thiol, or amino functional groups).

The use of a non-coherent radiation source to initiate curing in the various layers has the advantage over the use of a laser producing coherent radiation in that the whole of a layer of resin can be cured simultaneously rather than scanning the surface of the layer, as happens with a laser. An example of equipment that can be used to make three dimensional articles using a non-coherent radiation source is described in WO 00/21735. In addition, the laser produces local heating of the composition, which produces a non-uniform reaction of photoinitiators and also tends to ablate the resin surface. Non-coherent exposure does not incur such problems According to a second aspect of the present invention, there is provided an optical moulding composition comprising, in weight percent:

1 at least two curable components:

(i) a first component in an amount of 60%-90% (and preferably 70-85%) by weight, based on the total weight of the curable components in the composition, the first component being photocurable and such that, when cured in the presence of a photocuring initiator by exposure to UV radiation having an energy of 30 mJ/cm$^2$, at least 90% of the component is cured within 100 milliseconds, preferably within 50 milliseconds; and (ii) a curable second component in an amount of 5% to 30% (and preferably 10-25%, more preferably 10 to 20%) by weight of the total curable components in the composition, the second component being a compound having at least one terminal thiol (—SH) group, e.g. an oligomeric liquid polysulphides, a mercaptan monomer, a polythiol having two or more thiol groups per molecule, (e.g. a polythiol obtained by esterification of a polyol with an alpha. or β-mercaptocarboxylic acid, such as thioglycolic acid, or β-mercaptopropionic acid, or a pentaerythritol tetramercaptoacetate or pentaerythritol tetrakis-β-mercaptopropionate (PETMP))

2 0 to 10%, preferably 1 to 10% of a cationic photoinitiator, 3 0 to 10%, preferably 0.01 to 10, or preferably 1 to 10% of a radical photoinitiator, 4 0 to %, preferably 0.001 to 5% of a stabilizer against premature curing prior to use in the process, and 5 0 to 20% of auxiliary materials, e.g. fillers, particularly sub micron particles, 'nano size' fillers, e.g. siloxane particles, silica particles, nano-clays, nano-metals, nano-tubes.

Preferably the optical moulding composition according to the invention comprises, in weight percent:

(a) at least two curable components:

(i) a first component in an amount of at least 80%, preferably—at least 85% by weight, based on the total weight of the curable components in the composition, the first component being photocurable and such that, when cured in the presence of a photocuring initiator by exposure to UV radiation having an energy of 30 mJ/cm$^2$, at least 90% by weight of the component is cured within 100 milliseconds, preferably within 50 milliseconds; and (ii) a curable second component in an amount of at least 5% by weight of the total curable components in the composition, the second component being a compound having at least one terminal thiol (—SH) group, e.g. an oligomeric liquid polysulphides, a mercaptan monomer, a polythiol having two or more thiol groups per molecule, (e.g. a polythiol obtained by esterification of a polyol with an alpha. or β-mercaptocarboxylic acid, such as thioglycolic acid, or β-mercaptopropionic acid, or a pentaerythritol tetramercaptoacetate or pentaerythritol tetrakis-β-mercaptopropionate (PETMP)).

(b) 0 to 10%, preferably 1 to 10%, of a cationic photoinitiator, (c) 0.01 to 10% of a radical photoinitiator, Preferably, the first component has a high speed of cure such that at least 90% by weight of the first component is cured within 100 milliseconds (preferably within 50 milliseconds), when the first component is cured in the presence of a photocuring initiator by exposure to UV radiation having an energy of 20 mJ/cm$^2$ (more preferably 10 mJ/cm$^2$).

Preferably the photocurable composition also contains 1 to 10% by weight of one or more flexibilisers or tougheners, e.g. (e.g. (a)(d) a hydroxyl-containing compounds, (for example a polyester, polyether, polycarbonate or a polyurethane), or (b)(e) a thiol or amino counterpart of the hydroxyl versions), or a reactive rubber/elastomeric compound, (e.g. a polybutadiene having epoxy, acrylyl, amino, hydroxy, thiol, or amino functional groups, or a linear or cyclic polysiloxane having epoxy, acrylyl, hydroxyl, thiol, or amino functional groups).

Preferably the photocurable composition also contains one or more flexibiliser or toughener, (e.g. (f) a hydroxyl-containing compounds, (for example a polyester, polyether, polycarbonate or a polyurethane), or (g) a thiol or amino counterpart of the hydroxyl versions), or a reactive rubber/elastomeric compound, (e.g. a polybutadiene having epoxy, acrylyl, amino, hydroxy, thiol, or amino functional groups, or a core shell toughener with reactive or compatible surface or a linear or cyclic polysiloxane having epoxy, acrylyl, hydroxyl, thiol, or amino functional groups).

Preferably the first component is an acrylate and the second component is a thiol containing compound. When the first component includes a carbon-carbon double bond, e.g. an acrylate, it is preferred and the ratio of double bonds to thio groups in the composition is in the range of 10:1 to 2:1, e.g. 9:1 to 4:1, for example 8:1 to 5:1.

In one aspect the preferred curable compositions are those which cure or polymerize with high sensitivity, especially using non-coherent irradiation, and have low shrink properties after cure in the non-laser CAD system, preferably less than 5%, more preferably less than 3%, most preferably about 0%. With these preferred low shrink qualities, additionally the compositions after cure in non-laser CAD systems have following spectrum of properties:

| Property | preferred Cured Properties |
| --- | --- |
| Tg, C. | Greater than 50 C., preferably 100 C., more preferably 120 C. |
| Tensile Strength, Mpa | Greater than 40, preferably 50, more preferably 70 |
| Tensile Modulus, MPa | Greater than 2000, preferably 2500 to 3000 |
| Elongation at Break, % | 5 to 20 |
| Flex Stress, MPa | Greater than 50 |
| Flex Modulus, MPa | Greater than 1500, preferably 2000, more preferably 2500 |
| Fracture Resistance, Izod Impact, J/m | Greater than 30, preferably 50 to 100 |

The compositions may comprise single monomers, or oligomers, or reactive polymers, or mixtures of suitable reactive components, which on curing yield the desired properties, via a non-laser CAD system.

In another aspect, the present invention provides a photocurable composition comprising (a) a first photopolymer mixture, which on polymerization induces an immediate increase in viscosity and (b) a second photopolymer mixture, which is slower reacting than (a), and results in less shrinkage and higher Tg cured properties compared to the first mixture.

In another aspect, the present invention provides a photocurable composition comprising (a) a first photopolymer mixture, which on polymerization induces an immediate increase in viscosity and (b) a second photopolymer mixture which is slower reacting, and results in less shrinkage and higher Tg cured properties compared to the first mixture, such that the ultimate composite article formed from this mixture, particularly via layer techniques, has thermoplastic properties.

In yet another aspect, the present invention provides a photocurable composition comprising (a) a first photopolymer mixture, which on polymerization induces an immediate increase in viscosity and (b) a second photopolymer mixture which is slower reacting, and results in less shrinkage and higher Tg cured properties compared to the first mixture, such that the ultimate composite article formed from this mixture, particularly via layer techniques, has thermoplastic properties which are stable with time [no change in mechanical properties, preferably at the conditions of use, e.g. temperatures below 120° C.].

There is also provided a process for producing a three-dimensional article in sequential cross-sectional layers in accordance with a model of the article by forming a first layer of the photocurable composition; exposing the first layer to actinic radiation in a pattern corresponding to a respective cross-sectional layer of the model sufficient to harden the first layer in the imaged area; forming a second layer of the photocurable composition above the hardened first layer; exposing the second layer to actinic radiation in a pattern corresponding to a respective cross-sectional layer of the model sufficient to harden the second layer in the imaged area; and repeating the previous two steps to form successive layers as desired to form the three-dimensional article, wherein the model is produced in 50% less time than from corresponding other current machines, e.g. stereolithography, laser sintering, extrusion system. The model preferably has the stable, thermoplastic-like properties described previously.

DETAILED DESCRIPTION OF THE INVENTION

"Three-dimensional article" means an article made from at least two layers of a cured resin composition. The production of the article therefore involves 2 components:

A: The IMAGING SYSTEM or PROCESS

B: The MATERIAL[s] used in conjunction with A.

The final properties, as well as the speed of production, of the articles are totally a consequence of the interaction of A and D.

This invention discloses the optimum route to desired higher properties in the article, furthermore produced at higher speeds.

A: The IMAGING System or Process

This process involves some information means [CAD based], which is provided to the machine system which layer-wise addresses the material, to form ultimately the final 'three-dimensional article'.

The 2 layers can be same or different according to provided CAD information.

The CAD information maybe from a graphics design package, or an engineering design package, or from computer tomography image slices, or ultrasound depth slices, or from ultra-toned micro slices used for scanning electron microscopy, to name a few.

The CAD information is used to activate an 'exposure' system to address a layer of the material. In the current commercial systems, the exposure system uses a high power UV laser, e.g. as in stereolithography [U.S. Pat. No. 4,575,330], or high power infra-red laser, e.g. in Laser Sintering. Alternative proposals involve UV exposure through a mask [Alan J Herbert, Solid Object Generation, Journal of Applied Photographic Engineering 8(4), August 1982, pg 185-188, May 18, 1982.]. More recently, there are reported in WO 00/21735 new concepts using digitally controlled UV exposure of irradiation from a conventional UV source. The latter particularly is described as holding promise for production of models at 10× the speed previously possible, especially useful for production of bigger models.

Another possibility is that described in EP1250997A1 and EP1253002A1.

Another possibility is as described in US20040036200A1, US20040207123A1, WO 03041875, WO 03/099947 A1 and references therein which use jetting of UV curable fluids which are then cured by some non-laser irradiation.

Another possibility is use in direct printing e.g. U.S. Pat. No. 6,259,962 and related patents This range of art generally discloses the machine/equipment method, but do not refer to the effect of the system on the ultimate properties attainable from such machines.

We have found that use of conventional irradiation, rather than laser beam irradiation [e.g. from a UV laser source, i.e. diode pumped, frequency tripled YAG at 355 nm], yields higher performance in the cured & formed articles.

Selection of certain material types enables surprisingly to capitalize on the high speed addressability claimed in systems such as that described in WO00/21735 which use conventional irradiation sources, and yet also achieve the higher properties required by the industry.

B: Materials

Materials are compositions which interact with the exposure system and in some manner convert from an original form into a form which is differentiated from original state, which allows layer-wise, layer stitching to occur as the object is built up in layers according to programmed information and which further is separated readily from the initial state of the material.

For stereolithography, a UV sensitive photopolymer is used [as discussed previously].

Without being bound by theory, or limited in any way, it is believed that laser based systems produce an over production of initiating species which promote polymerization, resulting in short polymerization networks, ultimately limiting the properties attainable via a laser system. Clearly, any attempt to reach faster exposure speeds [and thus attain faster access to the formed three dimensional article], by using higher laser powers results in, not only, an even greater production of species for the desired faster polymerization initiation, but greater tendency to produce laser induced heating/ablation effects: non-linear delineation from expected performance leads to compromises in system and materials performance.

Conventional irradiation systems can provide much better polymerization kinetics and thermodynamics: however speed and efficiency of the materials to utilize available initiating energy becomes limited. This is especially so in the layer-wise technique for production of three-dimensional articles.

Radically cured systems are by far the fastest polymerization systems, e.g. acrylics, compared e.g. to cationic [epoxy] systems and would appear suitable to use with the exposure systems as described in WO00/21735. However, these materials tend to shrink greatly [up to 8%]. Such shrinkage can cause part distortion, internal stresses and consequent loss of desired properties.

We disclose certain composition types, which have the high speed to conform to the imaging processes and yet still produce low shrink, higher performance cured articles.

The general composition type comprises at least 2 polymerization systems which are compatible with each other:

(a) A first photocurable component which comprises any photosensitive material which on exposure to an irradiation energy of at most 80 $mJcm^{-2}$ undergoes a viscosity change of at least 10×, from the starting viscosity, and (b) A second curable component which is slower reacting than the first mixture and which results in a low shrinkage cured network compatible and integrated with that from (a).

Preferably the starting viscosity for (a) is about 1000 cps at 25° C., more preferably 500 cps and most preferably less than 200 cps.

Preferably the slower reacting second photopolymer yields lower shrink [preferably less than 3%, more preferably 0% and ideally even expands slightly], and higher Tg than that from (a). Some integrated phase separation is highly desired to achieve fracture impact stabilization.

Preferably, the total curable components in the composition is formed from first component and second component only i.e. there is no other curable component or in a negligible amount. Preferably the composition contains no solvent.

These Materials are exemplified by following non-exhaustive types:

1) Acrylic-methacrylic blends, comprising mono, bis and higher order functionalities, and comprising urethane, polyether, polyester, polyaromatic, perhydro-aromatic, etc inter links.

The acrylic part represents component (a) and methacrylic representing the (b) type.

Some suitable types are available from CIA, Sartomer and Rahn.

2) Acrylic-thio blends, additionally containing methacrylics, as per 1).

E.g.: Oligomeric liquid polysulphides and/or mercaptan monomers with acrylate and/or alkenes, for example those available on http://torayfinechemicals.com/english/pori.html and http://www.thioplasts.com/

3) Acrylic-isocyanate blends containing latent polyols [e.g. from epoxies], or polyamines [e.g. from blocked amines, e.g. aliphatic amines from carbamates, J. Mater. Chem., 2004, 14(3), 336-343]

Hybrid Isocyanate functionalized (urethane) acrylates or isocyanate as a separate component, e.g. Bayer Roskydals as described on http://www.bayer-ls.com/ls/lswebcms.ns/id/0011002_CHE Reaction with moisture or Use of Photolatent bases—Ciba as described on http://www.cibasc.com/view.asp?id=6822

4) Cycloaliphatic epoxies, and glycidyl epoxies, with acid amplifiers, and oxetanes/furans 5) Hybrid Acrylate/Epoxy Either as distinct separate materials or, if possible, dual functionality within the same molecule.

The following section gives general description of useful components going into the first and second components.

Acrylate-Containing Compound

"(Meth)acrylate" refers to an acrylate, a methacrylate, or a mixture thereof. Acrylates may be used as the whole or part of the first component, whereas methacrylates may, because they have a slower curing speed, be used as the second component.

The acrylate-containing compound may include at least one poly (meth) acrylate, e.g., a di-, tri-, tetra- or pentafunctional monomeric or oligomeric aliphatic, cycloaliphatic, or aromatic (meth) acrylate, provided the photocurable composition has less than 0.10 equivalents of acrylate groups per 100 grams of the composition. Difunctional (meth)acrylates are preferred, and aliphatic or aromatic difunctional (meth) acrylates are particularly preferred.

Examples of di(meth)acrylates include di(meth)acrylates of cycloaliphatic or aromatic diols such as 1,4-dihydroxymethylcyclohexane, 2,2-bis(4-hydroxy-cyclohexyl)propane, bis(4-hydroxycyclohexyl)methane, hydroquinone, 4,4'-dihydroxybiphenyl, Bisphenol A, Bisphenol F, Bisphenol S, ethoxylated or propoxylated Bisphenol A, ethoxylated or propoxylated Bisphenol F, and ethoxylated or propoxylated Bisphenol S. Di(meth)acrylates of this kind are known and some are commercially available, e.g., Ebecryl 3700 (Bisphenol-A epoxy diacrylate) (supplied by UCB Surface Specialties). A particularly preferred di(meth)acrylate is a Bisphenol A-based epoxy diacrylate.

Alternatively, the di(meth)acrylate may be acyclic aliphatic, rather than cycloaliphatic or aromatic. Di(meth)acrylates of this kind are known. Examples include compounds of the formulae (F-I) to (F-IV) of U.S. Pat. No. 6,413,697, herein incorporated by reference. Further examples of possible di(meth)acrylates are compounds of the formulae (F-V) to (F-VIII) of U.S. Pat. No. 6,413,697. Their preparation is also described in EP-A-0 646 580, herein incorporated by reference. Some compounds of the formulae (F-I) to (F-VIII) are commercially available.

A poly(meth)acrylate suitable for the present invention may include a tri(meth)acrylate or higher provided the photocurable composition has less than 0.10 equivalents of acrylate groups per 100 grams of the composition. Examples are the tri(meth)acrylates of hexane-2,4,6-triol, glycerol, 1,1,1-trimethylolpropane, ethoxylated or propoxylated glycerol, and ethoxylated or propoxylated 1,1,1-trimethylolpropane. Other examples are the hydroxyl-containing tri(meth)acrylates obtained by reacting triepoxide compounds (e.g., the triglycidyl ethers of the triols listed above) with (meth)acrylic acid. Other examples are pentaerydiritol tetraacrylate, bistrimethylolpropane tetraacrylate, pentaerythritol monohydroxytri(meth)acrylate, or dipentaerythritol monohydroxypenta (meth)acrylate.

The poly(meth)acrylate may include polyfunctional urethane (meth)acrylates. Urethane (meth)acrylates may be prepared by, e.g., reacting a hydroxyl-terminated polyurethane with acrylic acid or methacrylic acid, or by reacting an isocyanate-terminated prepolymer with hydroxyalkyl (meth) acrylates to give the urethane (meth)acrylate.

Examples of suitable aromatic tri(meth)acrylates are the reaction products of triglycidyl ethers of trihydric phenols, and phenol or cresol novolaks containing three hydroxyl groups, with (meth)acrylic acid.

For use in the first component, the acrylate-containing compound includes a compound having at least one terminal and/or at least one pendant (i.e., internal) unsaturated group and at least one terminal and/or at least one pendant hydroxyl group. The presence of the hydroxy group aids in attaining high viscosity change. The photocurable composition of the present invention may contain more than one such compound. Examples of such compounds include hydroxy mono(meth) acrylates, hydroxy poly(meth)acrylates, hydroxy monovinylethers, and hydroxy polyvinylethers. Commercially available examples include dipentaerythritol pentaacrylate (SR® 399; supplied by SARTOMER Company), pentaerythritol triacrylate (SR® 444; supplied by SARTOMER Company), and bisphenol A diglycidyl ether diacrylate (Ebecryl 3700; supplied by UCB Surface Specialties).

The following are examples of commercial poly(meth) acrylates: SR®D 295 (Pentaerythictol tetracrylate), SR® 350 (trimethylolpropane trimethacrylate), SR® 351 (Trimethylolpropane triacrylate), SR®V 367 (Tetramethylolmethane tetramethacrylate), SR® 368 (tris(2-acryloxy ethyl) isocyanurate triacrylate), SR® 399 (dipentaerythritol pentaacrylate), SR® 444 (pentaerythritol triacrylate), SR® 454 (Ethoxylated (3) trimethylolpropane triacrylate), SR® 9041 (dipentaerythritol pentaacrylate ester), and CN® 120 (bisphenol A-epichlorohydrin diacrylate) (all of the foregoing supplied by SARTOMER Company).

Additional examples of commercially available acrylates include KAYARAD R-526 (Hexanedioic acid, bis[2,2-diethyl-3-[(1-oxo-2-propenyl)oxy]propyl]ester); Sartomer 238 (Hexamethylenediol diacrylate), SR®D 247 (Neopentyl glycol diacrylate), SR® 306 (Tripropylene glycol diacrylate), Kayarad R-551 (Bisphenol A polyethylene glycol diether diacrylate), Kayarad R-712 (2,2'-Methylenebis[p-phenylenepoly(oxyethylene)oxy]diethyl diacrylate), Kayarad R-604 (2-Propenoic acid, [2-[1,1-dimethyl-2-[(1-oxo-2-propenyl) oxy]ethyl]-5-ethyl-1,3-dioxan-5-yl]methyl ester), Kayarad R-684 (Dimethyloltricyclodecane diacrylate), Kayarad PET-30 (Pentaerythritol triacrylate), GPO-303 (Polyethylene glycol dimethacrylate), Kayarad THE-330 (Ethoxylated trimethylolpropane triacrylate), DPHA-2H, DPHA-2C and DPHA-21 (dipentaerythritol hexaacrylate), Kayarad D-310 (DPHA), Kayarad D-330 (DPHA), DPCA-20, DPCA-30, DPCA-60, DPCA-120, DN-0075, DN-2475, Kayarad T-1420 (Ditrimethylolpropane tetraacrylate), Kayarad T-2020 (Ditrimethylolpropane tetraacrylate), T-2040, TPA-320, TPA-330, Kayarad RP-1040 (Pentaerythritol ethoxylate tetraacrylate), R-011, R-300, R-205 (Methacrylic acid, zinc salt, same as SRO 634) (Nippon Kayaku Co., Ltd.), Aronix M-210, M-220, M-233, M-240, M-215, M-305, M-309, M-310, M-315, M-325, M-400, M-6200, M-6400 (Toagosei Chemical Industry Co, Ltd.), Light acrylate BP-4EA, BP-4PA, BP-2EA, BP-2PA, DCP-A (Kyoeisha Chemical Industry Co., Ltd.), New Frontier BPE-4, TEICA, BR-42M, GX-8345 (Daichi Kogyo Seiyaku Co., Ltd.), ASF-400 (Nippon Steel Chemical Co.), Ripoxy SP-1506, SP-1507, SP-1509, VR-77, SP-4010, SP-4060 (Showa Highpolymer Co., Ltd.), NK Ester A-BPE-4 (Shin-Nakamura Chemical Industry Co., Ltd.), SA-1002 (Mitsubishi Chemical Co., Ltd.), Viscoat-195, Viscoat-230, Viscoat-260, Viscoat-310, Viscoat-214HP, Viscoat-295, Viscoat-300, Viscoat-360, Viscoat-GPT, Viscoat-400, Viscoat-700, Viscoat-540, Viscoat-3000, Viscoat-3700 (Osaka Organic Chemical Industry Co., Ltd.).

The photocurable composition of the present invention may include mixtures of the acrylate-containing compounds described above, combined with methacrylics, the latter being slower reacting second component.

Poly Thiol-Containing Compounds that can Form the Whole or Part of the Second Component The polythiol component of the inventive compositions may be any compound having two or more thiol groups per molecule. Suitable polythiols are described in U.S. Pat. No.

3,661,744 at Col. 8, line 76-Col. 9, line 46; in U.S. Pat. No. 4,119,617, Col. 7, lines 40-57; U.S. Pat. Nos. 3,445,419; and 4,289,867. Especially preferred are polythiols obtained by esterification of a polyol with an alpha. or β-mercaptocarboxylic acid such as thioglycolic acid, or β-mercaptopropionic acid. Particularly preferred polythiols are pentaerythritol tetramercaptoacetate and pentaerythritol tetrakis-β-mercaptopropionate (PETMP).

The ratio of the polyene to the polythiol component can be varied widely. Generally it is preferred that the ratio of ene to thio groups be from 10:1 to 2:1, e.g. 9:1 to 4:1, for example 8:1 to 5:1 but ratios outside this range may occasionally be usefully employed without departing from the invention hereof.

While a curable composition using compounds of the invention may include both difunctional ene compounds and difunctional thiol compounds, it will be understood that at least a portion of at least one of these components should contain more than two functional groups per molecule to produce a crosslinked product when cured. That is, the total of the average number of ene groups per molecule of polyene and the average number of corrective thiol groups per molecule of the polythiol should be greater than 4 when a crosslinked cured product is desired. This total is referred to as the “total reactive functionality” of the composition.

Epoxy-Containing Compound

Any epoxy-containing compound is suitable for the present: some examples of epoxy-containing compounds suitable for use in this invention are disclosed in U.S. Pat. No. 5,476,748, U.S. Patent Publication No. 2001/0046642 A1, and U.S. Patent Publication No. 2002/0160309, all of which are incorporated herein by reference. In particular for use as component (a), epoxy compounds which can be accelerated to ring open by photo generated acids e.g. from tri-aryl sulfonium $SbF_6$ salts, in a process which can be further catalyzed/amplified by acid labile amplifiers [such as exemplified in J Mat Chem, 2001, 11, 295-301].

Preferred epoxy-containing compounds suitable for the present invention as component (a) are non-glycidyl epoxies. Such epoxies include one or more epoxide compounds in which the epoxide groups form part of an alicyclic or heterocyclic ring system. Others include an epoxy-containing compound with at least one epoxycyclohexyl group that is bonded directly or indirectly to a group containing at least one silicon atom. These epoxies may be linear, branched, or cyclic in structure. Examples are disclosed in U.S. Pat. No. 5,639,413, which is incorporated herein by reference. Still others include epoxides which contain one or more cyclohexene oxide groups and epoxides which contain one or more cyclopentene oxide groups. Examples are disclosed in U.S. Pat. No. 3,117,099, which is incorporated herein by reference.

Particularly suitable non-glycidyl epoxies include the following difunctional non-glycidyl epoxide compounds in which the epoxide groups form part of an alicyclic or heterocyclic ring system: bis(2,3-epoxycyclopentyl) ether, 1,2-bis(2,3-epoxycyclopentyloxy)ethane, 3,4-epoxycyclohexylmethyl 3,4-epoxycyclohexanecarboxylate, 3,4-epoxy-6-methyl-cyclohexylmethyl 3,4-epoxy-6-methylcyclohexanecarboxylate, di(3,4-epoxycyclohexylmethyl) hexanedioate, di(3,4-epoxy-6-methylcyclohexylmethyl) hexanedioate, ethylenebis(3,4-epoxycyclohexanecarboxylate, ethanediol di(3,4-epoxycyclohexylmethyl) ether, vinylcyclohexane dioxide, dicyclopentadiene diepoxide or 2-3,4-epoxycyclohexyl-5,5-spiro-3,4-epoxy)cyclohexane-1,3-dioxane, and 2,2'-Bis-3,4-epoxy-cyclohexyl)-propane.

Highly preferred difunctional non-glycidyl epoxies include cycloaliphatic difunctional non-glycidyl epoxies. Such epoxies suitable for the present invention include 3,4-epoxycyclohexyl-methyl 3,4-epoxycyclohexanecarboxylate and 2,2'-Bis-(3,4-epoxy-cyclohexyl)-propane.

Most preferred difunctional non-glycidyl epoxy suitable for the present invention is 3,4-epoxycyclohexylmethyl 3,4-epoxycyclohexanecarboxylate.

The photocurable composition may include preferably as component (b) one or more epoxy-containing compounds that are polyglycidyl ethers, poly(P-methylglycidyl) ethers, polyglycidyl esters, poly(β-methylglycidyl) esters, poly(N-glycidyl) compounds, and poly(S-glycidyl) compounds.

The synthesis and examples of polyglycidyl ethers, poly(β-methylglycidyl) ethers, polyglycidyl esters and poly(β-methylglycidyl) esters are disclosed in U.S. Pat. No. 5,972,563, which is incorporated herein by reference.

Particularly important representatives of polyglycidyl ethers or poly(β-methylglycidyl) ethers are based on phenols; either on monocyclic phenols, for example on resorcinol or hydroquinone, or on polycyclic phenols, for example on bis(4-hydroxyphenyl)methane (bisphenol F), 2,2-bis(4-hydroxyphenyl)propane (bisphenol A), or on condensation products, obtained under acidic conditions, of phenols or cresols with formaldehyde, such as phenol novolaks and cresol novolaks. Examples of preferred polyglycidyl ethers include trimethylolpropane triglycidyl ether, triglycidyl ether of polypropoxylated glycerol, and diglycidyl ether of 1,4-cyclohexanedimethanol. Examples of particularly preferred polyglycidyl ethers include diglycidyl ethers based on bisphenol A and bisphenol F and mixtures thereof.

Poly(N-glycidyl) compounds are obtainable, for example, by dehydrochlorination of the reaction products of epichlorohydrin with amines containing at least two amine hydrogen atoms. These amines may, for example, be n-butylamine, aniline, toluidine, m-xylylenediamine, bis(4-aminophenyl)methane or bis(4-methylaminophenyl)methane. However, other examples of poly(N-glycidyl) compounds include N,N'-diglycidyl derivatives of cycloalkyleneureas, such as ethyleneurea or 1,3-propyleneurea, and N,N'-diglycidyl derivatives of hydantoins, such as of 5,5-dimethylhydantoin.

Examples of Poly(S-glycidyl) compounds are di-S-glycidyl derivatives derived from dithiols, for example ethane-1,2-dithiol or bis(4-mercaptomethylphenyl) ether.

It is also possible to employ epoxy-containing compounds in which the 1,2-epoxide groups are attached to different heteroatoms or functional groups. Examples of these compounds include the N,N,O-triglycidyl derivative of 4-aminophenol, the glycidyl ether/glycidyl ester of salicylic acid, N-glycidyl-N'-(2-glycidyloxypropyl)-5,5-dimethylhydantoin or 2-glycidyloxy-1,3-bis(5,5-dimethyl-1-glycidylhydantoin-3-yl)propane.

Other epoxide derivatives may be employed, such as vinyl cyclohexene dioxide, vinyl cyclohexene monoxide, 3,4-epoxycyclohexlmethyl acrylate, 3,4-epoxy-6-methyl cyclohexylmethyl-9,10-epoxystearate, 1,2-bis(2,3-epoxy-2-methylpropoxy)ethane, and the like.

Also conceivable is the use of liquid pre-reacted adducts of epoxy-containing compounds, such as those mentioned above, with hardeners for epoxy resins. It is of course also possible to use liquid mixtures of liquid or solid epoxy resins in the novel compositions.

The following are examples of commercial epoxy products suitable for use in the present invention: UVA 1500 (3,4-epoxycyclohexylmethyl-3,4-epoxycyclohexanecarboxylate; supplied by UCB Chemicals Corp.), Heloxy 48 (trimethylol propane triglycidyl ether; supplied by Resolution Performance Products LLC), Heloxy 107 (diglycidyl ether of cyclohexanedimethanol; supplied by Resolution Performance Products LLC), Uvacure 1501 and 1502 are proprietary cycloaliphatic epoxides supplied by UCB Surface Specialties of Smyrna, Ga.); Need also Uvacure 1531, Uvacure 1532, Uvacure 1533, Uvacure 1534 and Uvacure 1561 and Uvacure 1562; UVR-6105 (3,4-epoxycyclohexylmethyl-3,4-epoxycyclohexanecarboxylate), UVR-6100 (3,4-epoxycyclohexylmethyl-3,4-epoxycyclohexanecarboxylate), UVR-6110 (3,4-epoxycyclohexylmethyl-3,4-epoxycyclohexanecarboxylate), UVR-6128 (Bis(3,4-epoxycyclohexyl) Adipate), UVR-6200, UVR-6216 (1,2-Epoxyhexadecane), supplied by Union Carbide Corp. of Danbury, Conn.), the cycloaliphatic epoxides include Araldite CY 179 (3,4-epoxycyclohexylmethyl-3,4-epoxycyclohexanecarboxylate) and PY 284 and Celoxide 2021 (3, 4-Epoxycyclohexyl) methyl-3,4-epoxycyclohexyl carboxylate), Celoxide 2021 P (3'-4'-Epoxycyclohexane)methyl 3'-4'-Epoxycyclohexyl-carboxylate), Celoxide 2081 (3,4'-Epoxycyclohexane)methyl 3'-4'-Epoxycyclohexyl-carboxylate modified-caprolactone), Celoxide 2083, Celoxide 2085, Celoxide 2000, Celoxide 3000, Cyclomer A200 (3,4-Epoxy-Cyclohexlmethyl-Acrylate), Cyclomer M-100 (3,4-Epoxy-Cycloheylmethyl-Methacrylate), Epolead GT-300, Epolead GT-302, Epolead GT-400, Epolead 401, and Epolead 403 (all marketed by Daicel Chemical Industries Co., Ltd.).

The photocurable composition of the present invention may include mixtures of the epoxy-containing compounds described above.

Hydroxyl-Containing Compound

The photocurable composition of the present invention may contain one or more hydroxyl-containing compounds, used as flexibilisers or tougheners; corresponding thiols and amino counterparts can also be used. Preferably the hydroxyl-containing compound is difunctional. More preferably, the difunctional hydroxyl-containing compound is a polyether polyol. Most preferably, the polyether polyol is a polytetramethylene ether glycol ("poly THF"). The poly THF preferably has a molecular weight from about 250 to about 2500. The poly THF may be terminated with hydroxy, epoxy, or ethylenically unsaturated group(s). Polytetramethylene ether glycols are commercially available in the Polymeg® line (Penn Specialty Chemicals). Preferably, the photocurable composition of the present invention includes Polymeg® 1000, which is a linear diol with a nominal molecular weight of 1000 g.

Free Radical Photoinitiator

The free radical photoinitiator may be chosen from those commonly used to initiate radical photopolymerization. Examples of free radical photoinitiators include benzoins, e.g., benzoin, benzoin ethers such as benzoin methyl ether, benzoin ethyl ether, benzoin isopropyl ether, benzoin phenyl ether, and benzoin acetate; acetophenones, e.g., acetophenone, 2,2-dimethoxyacetophenone, and 1,1-dichloroacetophenone; benzil ketals, e.g., benzil dimethylketal and benzil diethyl ketal; anthraquinones, e.g., 2-methylanthraquinone, 2-ethylanthraquinone, 2-tertbutylanthraquinone, 1-chloroanthraquinone and 2-amylanthraquinone; triphenylphosphine; benzoylphosphine oxides, e.g., 2,4,6-trimethylbenzoy-diphenylphosphine oxide (Luzirin(® TPO); bisacylphosphine oxides; benzophenones, e.g., benzophenone and 4,4'-bis(N,N'-di-methylamino)benzophenone; thioxanthones and xanthones; acridine derivatives; phenazine derivatives; quinoxaline derivatives; 1-phenyl-1,2-propanedione 2-O-benzoyl oxime; 4¶-hydroxyethoxy)phenyl-(2-propyl)ketone (Irgacure 2959; Ciba Specialty Chemicals); 1-aminophenyl ketones or 1-hydroxy phenyl ketones, e.g., 1-hydroxycyclohexyl phenyl ketone, 2-hydroxyisopropyl phenyl ketone, phenyl 1-hydroxyisopropyl ketone, and 4-isopropylphenyl 1-hydroxyisopropyl ketone.

Preferably, the free radical photoinitiator is a cyclohexyl phenyl ketone. More preferably, the cyclohexyl phenyl ketone is a 1-hydroxy phenyl ketone. Most preferably the 1-hydroxy phenyl ketone is 1-hydroxycyclohexyl phenyl ketone, e.g., Irgacure 184 (Ciba Specialty Chemicals).

For stereolithography using a laser, the cationic and radical photoinitiators are preferably selected and their concentrations are preferably adjusted to achieve an absorption capacity such that the depth of cure at the normal laser rate is from about 0.1 to about 2.5 mm. "Stereolithography" is a process that produces solid objects from computer-aided design ("CAD") data. CAD data of an object is first generated and then is sliced into thin cross sections. A computer controls a laser beam that traces the pattern of a cross section through a liquid plastic, solidifying a thin layer of the plastic corresponding to the cross section. The solidified layer is recoated with liquid plastic and the laser beam traces another cross section to harden another layer of plastic on top of the previous one. The process continues layer by layer to complete the part. A desired part may be built in a matter of hours. This process is described in U.S. Pat. No. 5,476,748, U.S. Patent Publication No. 2001/0046642, and Paul F. Jacobs, *Rapid Prototyping & Manufacturing* 69-110 (1992), the entire contents of these documents are incorporated herein by reference.

Cationic Photoinitiator

The cationic photoinitiator may be chosen from those commonly used to initiate cationic photopolymerization. Examples include onium salts with anions of weak nucleophilicity, e.g., halonium salts, iodosyl salts, sulfonium salts, sulfoxonium salts, or diazonium salts. Metallocene salts are also suitable as photoinitiators. Onium salt and metallocene salt photoinitiators are described in U.S. Pat. No. 3,708,296; "UV-Curing, Science and Technology", (S. P. Pappas ed., Technology Marketing Corp.) and K. K. Dietliker, *Chemistry & Technology of UV & EB Formulations for Coatings, Inks & Paints*, Vol. 3 (P. K. Oldring 1991), each of which is incorporated herein by reference.

Examples of commercial cationic photoinitiators include UVI-6974, UVI-6976, UVI-6970, UVI-6960, UVI-6990 (DOW Corp.), CD1010, CD-1011, CD-1012 (Sartomer Corp.), Adekaoptomer SP150, SP-151, SP-170, SP-171 (Asahi Denka Kogyo Co., Ltd.), Irgacure 261 (Ciba Specialty Chemicals Corp.), CI-2481, CI-2624, CI-2639, CI2064 (Nippon Soda Co, Ltd.), and DTS-102, DTS-103, NAT-103, NDS-103, TPS-103, MDS-103, MPI-103, BBI-103 (Midori Chemical Co, Ltd.). Most preferred are UVI-6974, CD-1010, UVI-6976, Adekaoptomer SP-170, SP-171, CD-1012, and MPI-103. Especially preferred is a mixture of S,S,S,S'-Tetraphenylthiobis(4,1-phenylene)disulfonium dihexafluoroantimonate and diphenyl(4-phenylthiophenyl)sulfonium hexafluoroantimonate. The cationic photoinitiators can be used either individually or in combination of two or more.

Other Components

The photocurable composition of the present invention may contain a variety of other components. Examples of such components include, e.g., modifiers, tougheners, stabilizers, antifoaming agents, leveling agents, thickening agents, flame retardants, antioxidants, pigments, dyes, fillers, and combinations thereof.

Preferably the composition is substantially free of solvent which can be detrimental to an accurate building of a 3 D article.

The photocurable composition may contain reactive fillers as described in WO 03/089991.

The photocurable composition of the present invention may also contain one or more stabilizers. Preferred stabilizers are butylated hydroxytoluene ("BHT"), 2,6-Di-tert-butyl-4-hydroxytoluene, and hindered amines, e.g., benzyl dimethyl amine ("BDMA"), N,N-Dimethylbenzylamine.

In one embodiment of the present invention, the photocurable composition comprises as the first component (a) acrylic-containing compounds, and as the second component (b) thio-containing compound, and a free radical photoinitiator.

The photocurable compositions of the present invention are formulated so as to enable the production of three-dimensional articles having better performance when irradiated with conventional (non-coherent) UV rather than with Laser UV. The photocurable compositions of the present invention are more appropriate for UV non coherent irradiation than for Laser UV.

Exposure System:

A further aspect of the present invention includes a process for producing a three-dimensional article in sequential cross-sectional layers in accordance with a model of the article by forming a first layer of the photocurable composition; exposing the first layer to actinic radiation in a pattern corresponding to a respective cross-sectional layer of the model sufficient to harden the first layer in the imaged area; forming a second layer of the photocurable composition above the hardened first layer; exposing the second layer to actinic radiation in a pattern corresponding to a respective cross-sectional layer of the model sufficient to harden the second layer in the imaged area; and repeating the previous two steps to form successive layers as desired to form the three-dimensional article, wherein preferably, the exposure system uses irradiation from non-coherent light sources, e.g. a xenon fusion lamp, or light emitting diode bars.

Another method involves jetting of curable fluids either directly on a substrate or on powders, such that the jetted material is cured by electro-magnetic irradiation. The compositions claimed herewith which combine high speed reactive materials with reactive materials which counter act shrinkage, are useful also for such methods Those skilled in the art will appreciate that the various embodiments described above and in the experimental section that follow are meant to be exemplary, and that the invention may be practiced otherwise than as specifically described herein yet still within the scope of the claims and equivalents thereto.

Comparison Examples Using Laser Exposure Method

The general procedure used for preparing three-dimensional articles with stereolithography equipment, e.g. SLA7000, is as described in WO 03/089991.

For Example 2, the SLA exposure conditions were: Dp=5.5; Ec=3.5

Comparison EXAMPLES were also made using a flood exposure method on the resin sample contained in a mould Invention EXAMPLES were made using the method of WO 00/21735, courtesy of DICON A/S, Lystrup, Denmark.

EXAMPLES

1) Acrylic Composition

Stereolitiography Resin SL5131, an acrylic formulation, from Huntsman Advanced Materials, was imaged in an SL7000 machine and also according to the method of WO 00/21735.

Results are presented below, clearly showing improvement in Tensile Stress values:

| System | WO 00/21735 | SLA7000 |
|---|---|---|
| Tensile stress (MPa) | 62 | 40 |
| Elongation at break (%) | 3.3 | 2-3 |
| Tensile modulus (MPa) | 2210 | N/A |

2) Acrylic-Polythiol Composition 1

The following compounds were mixed at room temperature for 2 hours, under yellow light, in a brown bottle.

| Amount [g] | Component | CAS |
|---|---|---|
| 30.0 | Sartomer 833s | 42594-17-2 |
| 6.0 | Sartomer368 | 40220-08-4 |
| 34.8 | Sartomer 349 | 64401-02-8 |
| 17.0 | Ebecryl 8402 | |
| 9.0 | Ethoxylated Trimethylolpropan-tris-3-mercaptopropionate | NA |
| 2.0 | Irgacure 651 | 024650-42-8 |
| 1.2 | Lucirin TPO | 75980-60-8 |
| 0.08 | BHT | 128-37-0 |

Ebecryl 8402 is an urethane diacrylate component which has, according to US 20040181007, a Mw of 1000.

The composition was imaged in an SL7000 machine and also according to the method of WO 00/21735. Overall, there is significant improved performance via the conventional UV cure exposure through a layer wise CAD system, as compared to laser based stereolithography system.

| Property | SL7000 Method | Flood UV Exposure on Resin in a mould | WO 00/21735 Method |
|---|---|---|---|
| Tensile Strength, Mpa | 42 | 42 | 46 |
| Tensile Modulus, MPa | 2298 | 2137 | 2122 |
| Elongation at Break, % | 2.6 | 2.6 | 7 |
| Flex Stress, MPa | 48 | N/a | 56 |
| Flex Modulus, MPa | 1609 | N/a | 1570 |

The CAD system using non-laser irradiation yields best combination of properties. Layering also yields better results than simply mould curing the resin.

3) Comparison of Composition 1 with Stereocol 9300

Stereocol 9300 is a total acrylic composition comprising acrylics and urethane acrylate.

This type of resin therefore represents a comparison resin not having a second component which mitigates acrylic shrinkage issues Test bars for Stereocol 9300 and Acrylic-Thiolene Composition 1 were made according to following designs, in the system described in WO 00/21735, courtesy of Dicon, Lystrup, Denmark.

Tensile Test Bar

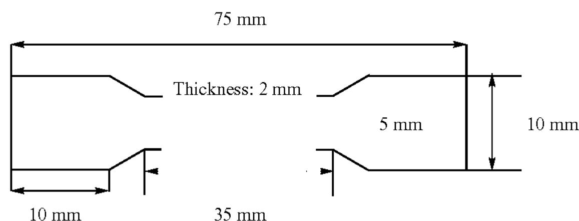

Charpy Test Bar

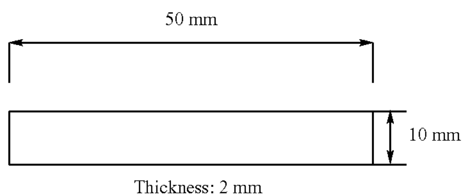

The results of these test bars are presented below:

| | Stereocol 9300 (all acrylic formulation) | Acrylic-Thiolene Composition 1 |
|---|---|---|
| Tensile stress (MPa) | 45.96 | 46 |
| Elongation at break (%) | 4.32 | 6 |
| Tensile modulus (MPa) | 1683.1 | 2122 |
| Flex stress (MPa) | 50.96 | 56 |
| Flex modulus (MPa) | 1510.3 | 1570 |
| Charpy impact (KJ/m$^2$) | 14.175 | 21 |
| Shrinkage % In length of tensile bar | Non-linear shrinkage in length of test bar: 1 mm at first 0.5 mm, reducing to 0.01 mm by 3 mm | Sharp corners and edges through out length of bar: <0.01 mm |

Examples 4 to 8

The following formulations were made by tumble mixing the components [wt %] in a brown jar, having tightly sealing cap: room temperature for 6 hours.

Viscosity of fluids was measured using a Brookfield HBTD Viscometer (0.8° cone spindle) at both 25° C.

Mould Cured Samples: the formulations were poured into a silicone mould and cured under UV (Fusion Systems F450 lamp, 120 W/cm$^2$, 7.5 s). The parts were removed from the mould, turned, and cured under UV again (Fusion SystemsF450 lamp, 120 W/cm$^2$, 7.5 s). Tensile properties were measured using Stable Micro Systems TA-HDi Texture Analyser, test speed 0.08 mm/s, grip distance 55 mm.

| Component | Example 4 | Example 5 | Example 6 | Example 7 | Example 8 |
|---|---|---|---|---|---|
| Epoxy UVACURE 1500 | 30 | 0 | 60 | 30 | 30 |
| Oxetane Cyracure UVR 6000 | 17 | 0 | 34 | 10 | 17 |
| Acrylic Sartomer 349 | 47 | 94 | 0 | 40 | 30 |
| Acrylic Sartomer 495 | 0 | 0 | 0 | 15 | 0 |
| Acrylic Sartomer 348 | 0 | 0 | 0 | 0 | 17 |
| Cyracure UVI 6976 | 3 | 0 | 6 | 2 | 3 |
| Irgacure 184 | 3 | 6 | 0 | 3 | 3 |
| N,N-dimethyl benzylamine | 0.05 | not available | na | na | na |
| Tensile Stress MPa | 72 | 52 | 67 | 46 | 75 |
| Elongation at break % | 5.0 | 3 | 3.4 | 3.4 | 4.1 |
| Modulus | 2175 | 2141 | 2214 | 1627 | 2213 |

Example 4 shows a synergistic improvement in properties by combining acrylic [example 5] and cationic [example 6] components. Example 4 is on borderline of being exposed using the method of WO 00/21735. However these formulations may have better usefulness in systems which jet selectively the curable fluid, which is then cured by e.g. UV irradiation.

The invention claimed is:

1. An optical moulding composition comprising, in weight percent:

(a) at least two curable components:

(i) a first component in an amount of at least 80%, based on the total weight of the curable components in the composition, the first component comprising an acrylate and an acid amplified system comprising at least one cationically photocurable material, a cationic photocuring initiator, and an acid amplifier, the first component being photocurable and such that, when cured in the presence of a photocuring initiator by exposure to UV radiation having an energy of 30 mJ/cm$^2$, at least 90% by weight of the first component is cured within 50 milliseconds, and (ii) a curable second component in an amount of at least 5% and at most 15% by weight of the total curable components in the composition, the second component being a compound having at least one terminal thiol group;

(b) 0.01 to 10%, by weight, of a radical photoinitiator, (c) 0.001 to 5% by weight of a stabilizer, and (d) 0 to 20% by weight of auxiliary materials.

2. A composition as claimed in claim 1, wherein at least 90% by weight of the first component is cured within 50 milliseconds, when the first component is cured in the presence of a photocuring initiator by exposure to UV radiation having an energy of 20 mJ/m$^2$.

3. A composition as claimed in claim 1, wherein the photocurable composition also contains 1 to 10% by weight of one or more flexibilisers or tougheners.

4. A composition as claimed in claim 1, wherein the first component includes a carbon-carbon double bond and the ratio of double bonds to thiol groups in the composition is 10:1 to 2:1.

* * * * *